(12) United States Patent
Yu et al.

(10) Patent No.: US 9,165,673 B2
(45) Date of Patent: Oct. 20, 2015

(54) SEMICONDUCTOR MEMORY DEVICE INCLUDING SENSING VERIFICATION UNIT

(71) Applicant: Samsung Electronics Co., Ltd., Suwon-Si, Gyeonggi-Do (KR)

(72) Inventors: Je-Min Yu, Seoul (KR); Ho-Young Song, Hwaseong-si (KR); Sung-Min Seo, Seoul (KR); Sang-Joon Hwang, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 182 days.

(21) Appl. No.: 13/795,567

(22) Filed: Mar. 12, 2013

(65) Prior Publication Data

US 2013/0242635 A1  Sep. 19, 2013

(30) Foreign Application Priority Data

Mar. 13, 2012  (KR) .......................... 10-2012-0025663

(51) Int. Cl.
*G11C 17/00*  (2006.01)
*G11C 17/16*  (2006.01)
*G11C 17/18*  (2006.01)

(52) U.S. Cl.
CPC ................ *G11C 17/00* (2013.01); *G11C 17/16* (2013.01); *G11C 17/18* (2013.01)

(58) Field of Classification Search
CPC ........................ G11C 16/3454; G11C 16/3459
USPC .............. 365/185.21, 185.22, 189.05, 189.07
See application file for complete search history.

(56) References Cited

U.S. PATENT DOCUMENTS

| 5,574,684 | A  | * | 11/1996 | Tomoeda | ................... | 365/185.04 |
| 7,307,911 | B1 | * | 12/2007 | Anand et al. | ................ | 365/225.7 |
| 7,474,566 | B2 | * | 1/2009  | Jung et al. | ................. | 365/185.22 |
| 8,508,972 | B2 | * | 8/2013  | Lee et al. | ......................... | 365/96 |
| 2005/0052892 | A1 | * | 3/2005 | Low et al. | ......................... | 365/94 |
| 2005/0157578 | A1 | * | 7/2005 | Noguchi et al. | .......... | 365/230.03 |
| 2009/0129149 | A1 | * | 5/2009 | Fujisawa et al. | .......... | 365/185.03 |
| 2009/0296458 | A1 | * | 12/2009 | Lee et al. | ....................... | 365/163 |
| 2010/0259974 | A1 | * | 10/2010 | Shin et al. | ...................... | 365/163 |

FOREIGN PATENT DOCUMENTS

| JP | 2005302091 A | 10/2005 |
| JP | 2009259384 A | 11/2009 |
| JP | 2010027104 A | 2/2010 |
| WO | WO-2010096915 A1 | 9/2010 |

OTHER PUBLICATIONS

Kim et al., "Three-Transistor One-Time Programmable (OTP) ROM Cell Array Using Standardized CMOS Gate Oxide Antifuse" (Electron Device Letters, IEEE , vol. 24, No. 9, pp. 589,591, Sep. 2003.*

* cited by examiner

*Primary Examiner* — Huan Hoang
*Assistant Examiner* — Minh Dinh
(74) *Attorney, Agent, or Firm* — Harness, Dickey & Pierce, P.L.C.

(57) ABSTRACT

A semiconductor memory device includes a memory cell array configured to store data including a verification code; a sensing unit configured to sense the stored data including the verification code; and a verification unit configured to determine whether the sensing unit is able to sense the stored data based on a sensing condition, wherein the verification unit is configured to determine whether the sensing unit is able to sense the stored data based on the sensing condition and a value of the verification code sensed by the sensing unit.

18 Claims, 15 Drawing Sheets

PRIOR ART

SEMICONDUCTOR MEMORY DEVICE INCLUDING SENSING VERIFICATION UNIT

CROSS-REFERENCE TO RELATED APPLICATIONS

This application claims the benefit of Korean Patent Application No. 10-2012-0025663, filed on Mar. 13, 2012, in the Korean Intellectual Property Office, the disclosure of which is incorporated herein in its entirety by reference.

BACKGROUND

Example embodiments relate to a semiconductor memory device, and more particularly, to a semiconductor memory device verifying a sensing condition through a verification code.

A one-time programmable (OTP) fuse device used as a semiconductor memory includes a conductive salicided polysilicon wire. A fuse is conducting with a low impedance in an unblown (unprogrammed) state. When a programming current (for example, about 20 mA) is applied to the salicided polysilicon wire so as to program an OTP memory, the salicided polysilicon wire is heated and blown, and thus, a high impedance connection is realized. When the fuse is blown, data recorded once cannot be erased. An OTP memory cell records data via a one-time program, and repeatedly reads the data. If data sensing is performed under an unstable condition, the data may be wrongly read.

SUMMARY

Example embodiments provide a one-time programmable (OTP) semiconductor memory device that senses under a verified sensing condition.

According to at least one example embodiment, a semiconductor memory device may include a memory cell array configured to store data including a verification code; a sensing unit configured to sense the stored data including the verification code; and a verification unit configured to determine whether the sensing unit is able to sense the stored data based on a sensing condition, wherein the verification unit is configured to determine whether the sensing unit is able to sense the stored data based on the sensing condition and a value of the verification code sensed by the sensing unit.

The verification unit may include a comparison unit configured to compare the sensed value of the verification code and a value of an original verification code, wherein the verification unit is configured to determine whether the sensing unit is able to sense the stored data based on the sensing condition and a comparison result of the comparison unit comparing the sensed value of the verification code and the value of the original verification code.

When the sensed value of the verification code and the value of the original verification code are the same based on the comparison result of the comparison unit, the verification unit may determine the sensing unit is able to sense the stored data The verification unit may include an alteration unit configured to change the sensing condition, and the verification unit and alteration unit may be configured such that when the sensed value of the verification code and the value of the original verification code are not the same based on the comparison result of the comparison unit, the verification unit determines that sensing unit is not able to sense the stored data using the sensing condition, the alteration unit changes the sensing condition, and the verification unit determines whether the sensing unit can sense the stored data using the changed sensing condition.

The sensing unit may be configured such that the sensing unit again senses the verification code stored in the memory cell array based on the changed sensing condition, the comparison unit may be configured such that the comparison unit again compares the again-sensed value of the verification code and the value of the original verification code, and the verification unit may be configured such that the verification unit determines whether the sensing unit is able to sense the stored data based on the changed sensing condition through a comparison result of the comparison unit comparing the again-sensed value of the verification code and the value of the original verification code again.

The verification unit may be configured such that when the sensed value of the verification code and the value of the original verification code are not the same, the verification unit repeats sensing while changing the sensing condition until the sensed value of the verification code is same as the value of the original verification code.

The verification unit may further include a counter configured to count the number of times the sensing condition is changed, and the verification unit may be configured to determine that the sensing unit is not able to sense the stored data when the number of times counted by the counter is equal to or above a reference number.

The sensing condition may include at least one of a sensing voltage level and a sensing timing.

The verification unit may include a buffer configured to store data about the sensing voltage level and the sensing timing.

The verification unit and the sensing unit may be configured such that if the verification unit determines that the data of the memory cell array is able to be sensed based on the sensing condition, the sensing unit senses the data based on the sensing condition determined by the verification unit.

The verification unit may be configured such that the verification unit performs a verification operation on the sensing condition, and the sensing unit may be configured such that if the verification unit determines that the sensing condition is verified, the sensing unit senses the data based on the sensing condition.

The semiconductor memory device may be a one-time programmable (OTP) semiconductor memory device.

According to at least on example embodiment, a semiconductor memory device may include a memory cell array configured to store data including a verification code; and a sensing unit configured to sense the stored data including the verification code, the sensing unit including a verification unit configured to determine whether the sensing unit is able to sense the stored data based on a sensing condition, the verification unit being configured to determine whether the data of the memory cell array is able to be sensed based on the sensing condition and a value of the verification code sensed by the sensing unit.

The verification unit may include a comparison unit configured to generate a comparison result based on the sensed value of the verification unit and a value of an original verification code, and the verification unit may be configured to determine whether the sensing unit is able to sense the stored data based on the sensing condition and the comparison result.

The verification unit may further include an alteration unit configured to change the sensing condition, and the verification unit and the alteration unit may be configured such that if the sensed value of the verification code and the value of the original verification code are not the same based on the comparison result, the verification unit determines that the sensing unit is not able to sense the stored data using the sensing condition, the alteration unit changes the sensing condition, and the verification unit determines whether the sensing unit is able to sense the stored data using the changed sensing condition.

According to at least one example embodiment, a semiconductor memory device may include a memory cell array storing verification data and non-verification data; a verification unit configured to output a first sensing condition; and a sensing unit configured to generate a sensed verification code by sensing the stored verification data based on the first sensing condition, and to output the sensed verification code to the verification unit, the verification unit being configured generate a verification result based on the sensed verification code and to output an enable signal based on the verification result, the sensing unit being configured to determine whether or not to sense the stored non-verification data based on the enable signal.

The verification unit may include a buffer storing a reference verification code; and a comparison unit configured to generate the verification result based on the sensed verification code and the reference verification code.

The comparison unit may be further configured to output a disable signal based on the verification result, and the verification unit may further include an alteration unit configured to generate an altered sensing condition by altering the first sensing condition based on the disable signal.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF THE EMBODIMENTS

Figure 1A:
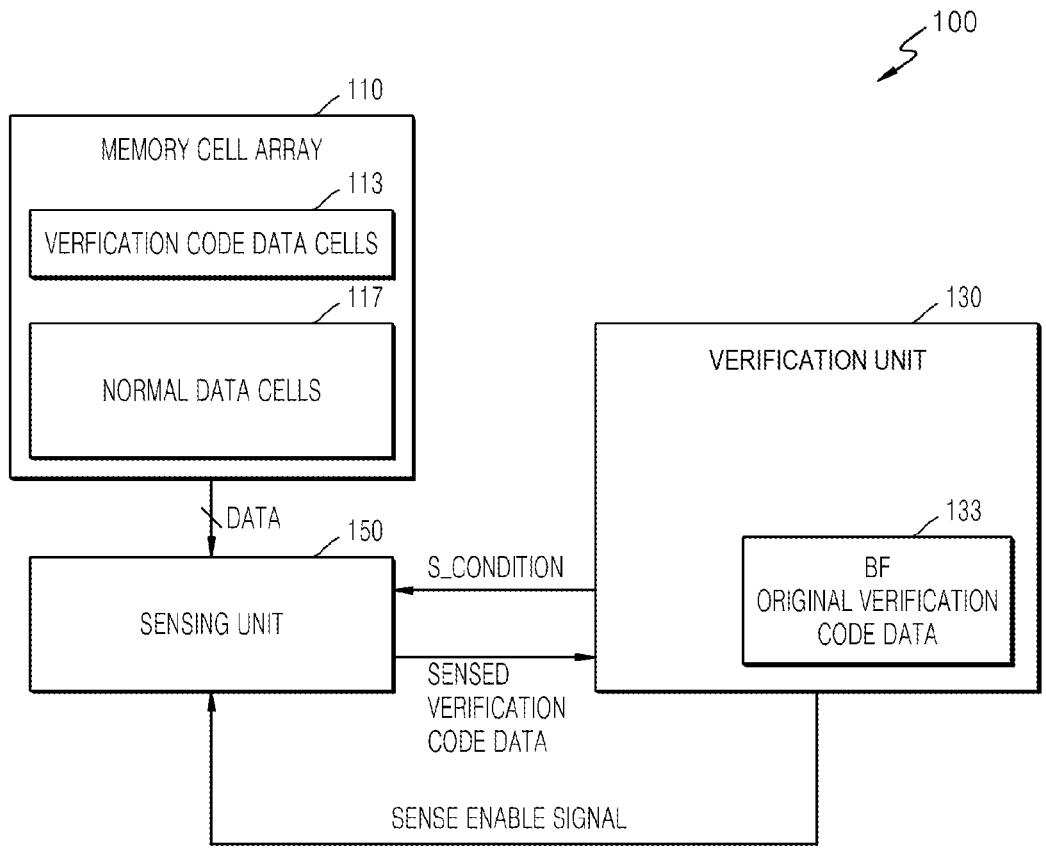
FIG. 1A is a block diagram of a semiconductor memory device according to at least one example embodiment.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1A is a block diagram of a semiconductor memory device 100 according to at least one example embodiment.

Referring to FIG. 1A, the semiconductor memory device 100 includes a memory cell array 110, a verification unit 130, and a sensing unit 150.

The memory cell array 110 may be a group of memory storage devices using a semiconductor material, and may be a one-time programmable (OTP) semiconductor memory device. Examples of an OTP memory using an antifuse based on a gate oxide breakdown include a memory having a 3-transistor OTP cell including an antifuse-type N-channel metal oxide semiconductor (NMOS) transistor, a high-voltage blocking transistor, and an access transistor, and a memory having a 2-transistor OTP cell including only an antifuse-type NMOS transistor and an access transistor and not a high-voltage blocking transistor.

Figure 1B:
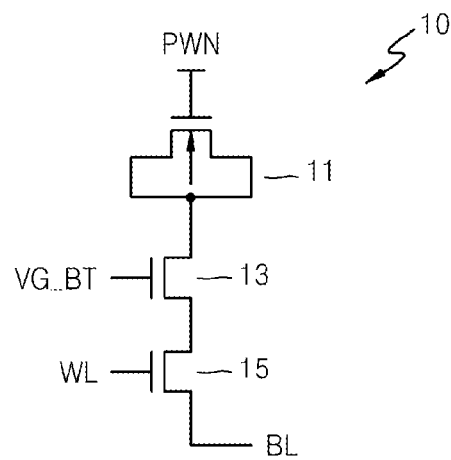
FIG. 1B is a circuit diagram of a one-time programmable (OTP) semiconductor memory cell included in a memory cell array, according to at least one example embodiment.

FIG. 1B is a circuit diagram of an OTP semiconductor memory cell 10 included in the memory cell array 110, according to at least one example embodiment.

Referring to FIG. 1B, the OTP semiconductor memory cell 10 according to at least one example embodiment includes an NMOS capacitor 11, a high-voltage blocking transistor 13, and an access transistor 15. As shown in FIG. 1B, the NMOS capacitor 11, the high-voltage blocking transistor 13, and the access transistor 15 are connected in series. A gate terminal of the NMOS capacitor 11 of an antifuse-type is connected to a power node PWN.

Operations of the OTP semiconductor memory cell 10 will now be described. In a 3-transistor OTP memory, a high VPP voltage, for example, 6.5 V, is applied as a gate voltage of the NMOS capacitor 11 during a program mode regardless of a cell to be selected. In order to program a selected cell, voltages of a word line WL and a gate node VG_BT of the high-voltage blocking transistor 13 are applied at a VDD level, for example, 1.8 V, and a voltage of 0V is applied to a bit line BL V, and thus, a gate-oxide of the NMOS capacitor 11 is broken.

In a cell that is not to be programmed, the voltages of the gate node VG_BT and the word line WL are applied at the VDD level and the voltage of the bit line BL is applied at the VDD level, thereby turning off the access transistor 15. Alternatively, when the voltage of 0 V is applied to the word line WL, the access transistor 15 is turned off, and thus, the NMOS capacitor 11 is not broken.

During a read mode, the gate voltage of the NMOS transistor 11 is applied at the VDD level. In a cell that is programmed, the gate-oxide of the NMOS capacitor 11 is broken and changed to a resistance component, and thus, forms a current path between a VPP node and the bit line BL. Information about a current flowing through the bit line BL in a low state is output through a bit line detection amplifier.

In a cell that is not programmed, the NMOS capacitor 11 is not broken and maintains its shape. Thus, a current does not flow between the VPP node and the bit line BL, and information in a high state is output.

Referring back to FIG. 1A, the memory cell array 110 may include verification code data cells 113, and a normal data cells 117. The verification code data cells 113 stores predetermined or, alternatively, reference verification code data. The verification code data may have, for example, a fixed value, and is used to verify a sensing condition. For example, the verification code data may be in 16 bits or 64 bits. For example, the verification code data may be a 4×4 bit array. Alternatively, the verification code data may be an 8×8 bit array.

The normal data cells 117 may be non-verification cell storing normal data excluding the verification code data. The normal data may include metadata about the normal data. The normal data may include sensing condition data, data about a sensing condition changing method, sensing condition variable data, and data about a sensing condition comparing method.

The sensing unit 150 senses data stored in the memory cell array 110. The term sensing is used in a concept that includes reading. Sensing may be performed by using a general sensing method of a semiconductor memory device. For example, a row decoder decodes a row address signal input by a row address buffer. The decoded row address signal may activate a word line of a memory cell array. A column decoder decodes a column address signal. The decoded column address signal may perform a selection operation on a bit line of the memory cell array. Data of a memory cell selected by the row decoder and the column decoder may be provided to the sensing unit 150.

The verification unit 130 verifies a sensing condition S_Condition. In the present specification, the sensing condition S_Condition includes a physical value about an environment and process of sensing data by the sensing unit 150. For example, the sensing condition S_Condition may include a sensing temperature, a sensing voltage, a sensing timing, sensing power, a sensing operation order, and sensing sensitivity. Also, the sensing condition S_Condition may change based on a physical and chemical characteristic of a semiconductor memory device, a sensing time of a semiconductor memory device, and a peripheral environment of a semiconductor memory device.

According to another embodiment, the verification unit 130 may consider a change of the sensing condition S_Condition of the semiconductor memory device 100. For example, the verification unit 130 may pre-predict that a sensing voltage is to be changed. In this case, the verification unit 130 may sense a sensing condition at a low accuracy, for example, in a low sensing voltage or a late sensing timing, by considering the sensing voltage to be changed. After verifying the sensing condition at a low accuracy, the verification unit 130 may sense normal data in a sensing condition of high accuracy, for example, in a high sensing voltage or a quick sensing timing.

The verification unit 130 may include a buffer 133 storing an original verification code. The buffer 133 may be a volatile or nonvolatile memory. Alternatively, the buffer 133 may be a random access memory (RAM) or a read only memory (ROM). Alternatively, the buffer 133 may be a dynamic RAM (DRAM), a static RAM (SRAM), a phase-change RAM (PRAM), a magnetic RAM (MRAM), a resistance RAM (ReRAM), a ferroelectric RAM (FRAM), a NOR flash memory, a NAND flash memory, or a fusion flash memory (for example, a memory in which an SRAM buffer, a NAND flash memory, and a NOR interface logic are combined).

Operations of the semiconductor memory device 100 will now be described. When the semiconductor memory device 100 is powered on, the sensing unit 150 receives the sensing condition S_Condition from the verification unit 130. The sensing unit 150 senses the verification code data of the verification code data cells 113 included in the memory cell array 110 based on the sensing condition S_Condition received from the verification unit 130. The sensing unit 150 transmits the sensed verification code data to the verification unit 130. The verification unit 130 may store original verification code data in the buffer 133. The verification unit 130 verifies the sensing condition S_Condition by using the original verification code data and the sensed verification code data. The verification unit 130 may generate a sense enable signal when it is determined that the sensing condition S_Condition may be sensed without an error. When it is not determined that the sensing condition S_Condition may be sensed without an error, the verification unit 130 does not generate a sense enable signal. The verification unit 130 transmits the sense enable signal to the sensing unit 150. The sensing unit 150 senses the normal data stored in the normal data cells 117 through the verified sensing condition S_Condition. Accordingly, the semiconductor memory device 100 may perform sensing based on a stable sensing condition.

Figure 2:
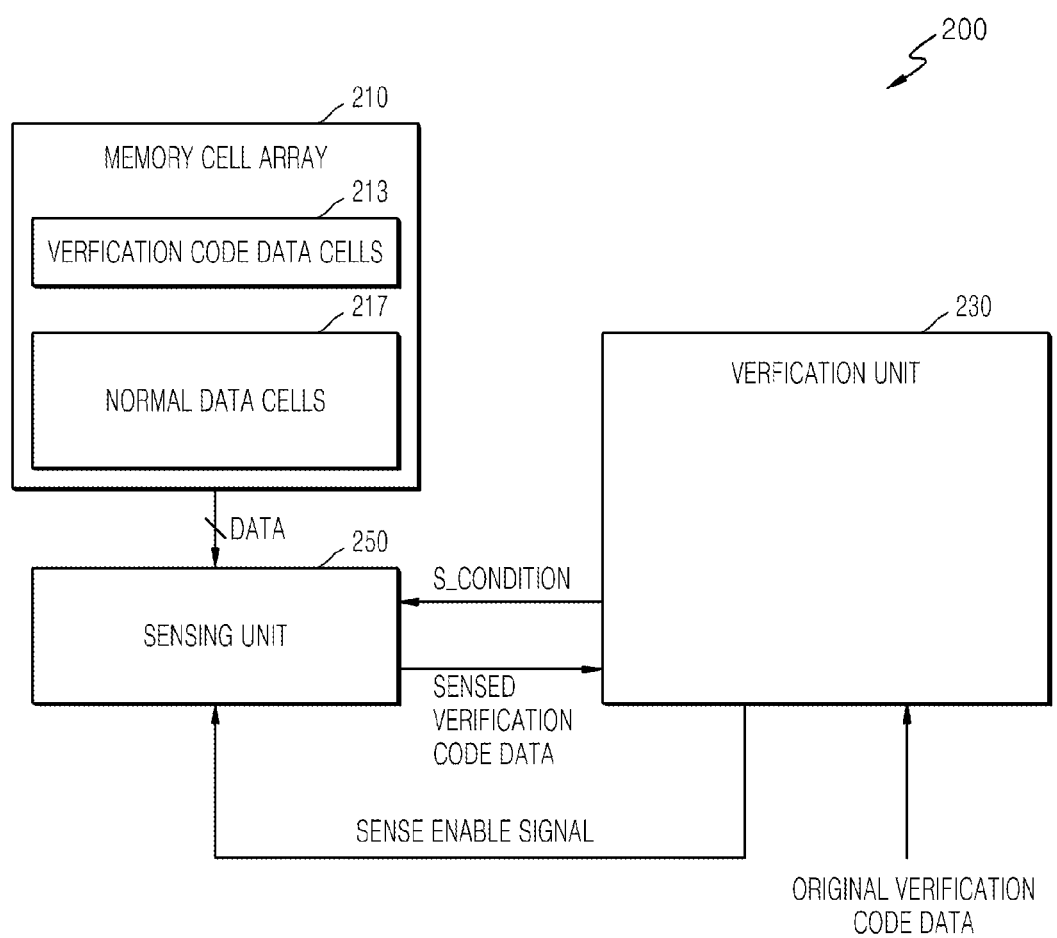
FIG. 2 is a block diagram of a semiconductor memory device according to at least one example embodiment.

FIG. 2 is a block diagram of a semiconductor memory device 200 according to at least one example embodiment.

Referring to FIG. 2, the semiconductor memory device 200 includes a memory cell array 210, a verification unit 230, and a sensing unit 250. The memory cell array 210 and the sensing unit 250 of FIG. 2 respectively correspond to and perform the same functions as the memory cell array 110 and the sensing unit 150 of FIG. 1A.

Unlike the verification unit 130 of FIG. 1A, the verification unit 230 according to the current embodiment does not include the buffer 133. However, original verification code data is received from outside the verification unit 230. Accordingly, the semiconductor memory device 200 according to the current embodiment may verify a stable sensing condition even when the verification unit 230 and a verification code data cell 213 are similarly distorted by the same environment (for example, when noise of a transmission and a reception path is inserted to the verification unit 230 and the verification code data cell 213 to a similar level or when the verification unit 230 and the verification code data cell 213 are distorted due to a temperature change.

Figure 3:
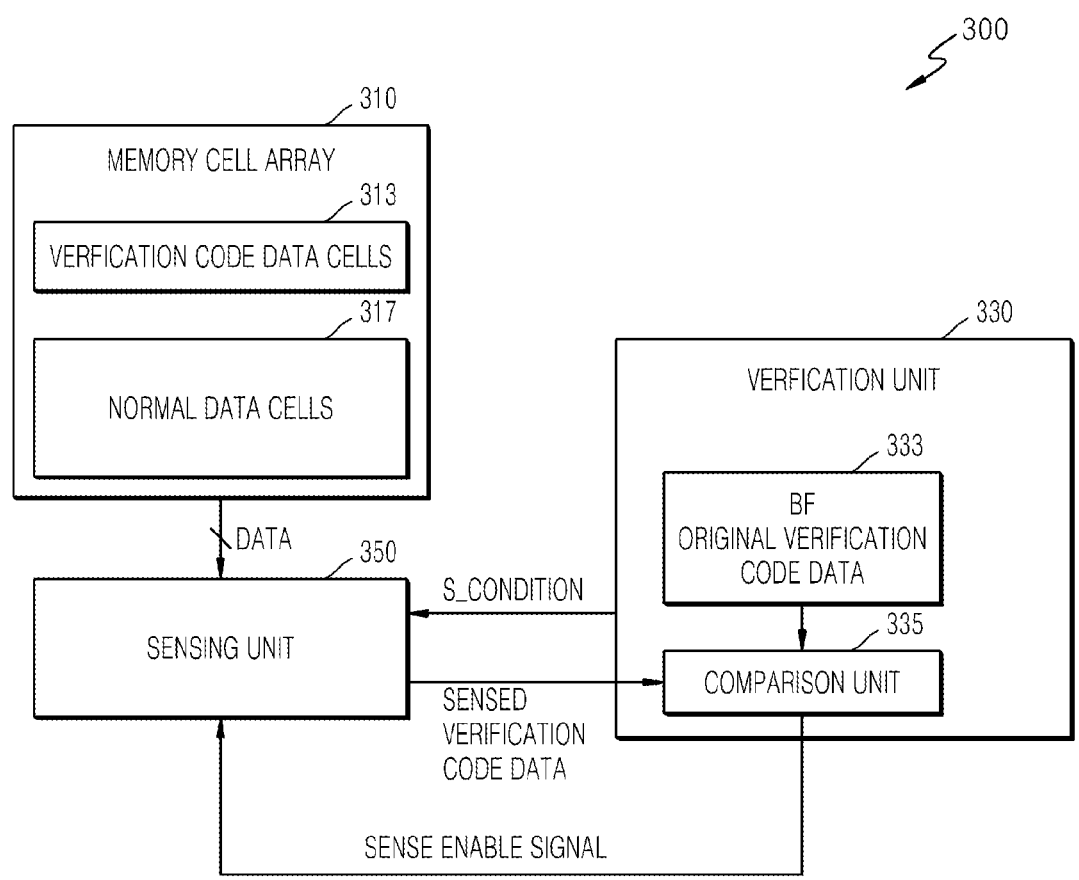
FIG. 3 is a block diagram of a semiconductor memory device according to at least one example embodiment.

FIG. 3 is a block diagram of a semiconductor memory device 300 according to at least one example embodiment.

Referring to FIG. 3, the semiconductor memory device 300 includes a memory cell array 310, a verification unit 330, and a sensing unit 350. The memory cell array 310 and the sensing unit 350 of FIG. 3 respectively correspond to and perform the same functions as the memory cell array 110 and the sensing unit 150 of FIG. 1A.

The verification unit 330 according to the current embodiment includes a buffer 333 storing original verification code data. Descriptions of the buffer 333 of the verification unit 330 are substantially the same as those of the buffer 133 of FIG. 1A. The verification unit 330 of the current embodiment further includes a comparison unit 335.

The comparison unit 335 may compare sensed verification code data and the original verification code data. Also, the comparison unit 335 may generate a sense enable signal when the sensed verification code data and the original verification code data are the same. The comparison unit 335 may transmit the sense enable signal to the sensing unit 350.

Operations of the semiconductor memory device 300 will now be described. The sensing unit 350 senses verification code data stored in a verification code data cell 313 based on a sensing condition S_Condition. The sensed verification code data is transmitted to the comparison unit 335. The comparison unit 335 compares the original verification code data and the sensed verification code data. When the sensed verification code data and the original verification code data are the same, the comparison unit 335 may generate a sense enable signal. The comparison unit 335 may transmit the sense enable signal to the sensing unit 350. Accordingly, the semiconductor memory device 300 may perform sensing based on a stable sensing condition by reflecting a comparison result of the comparison unit 335.

Figure 4:
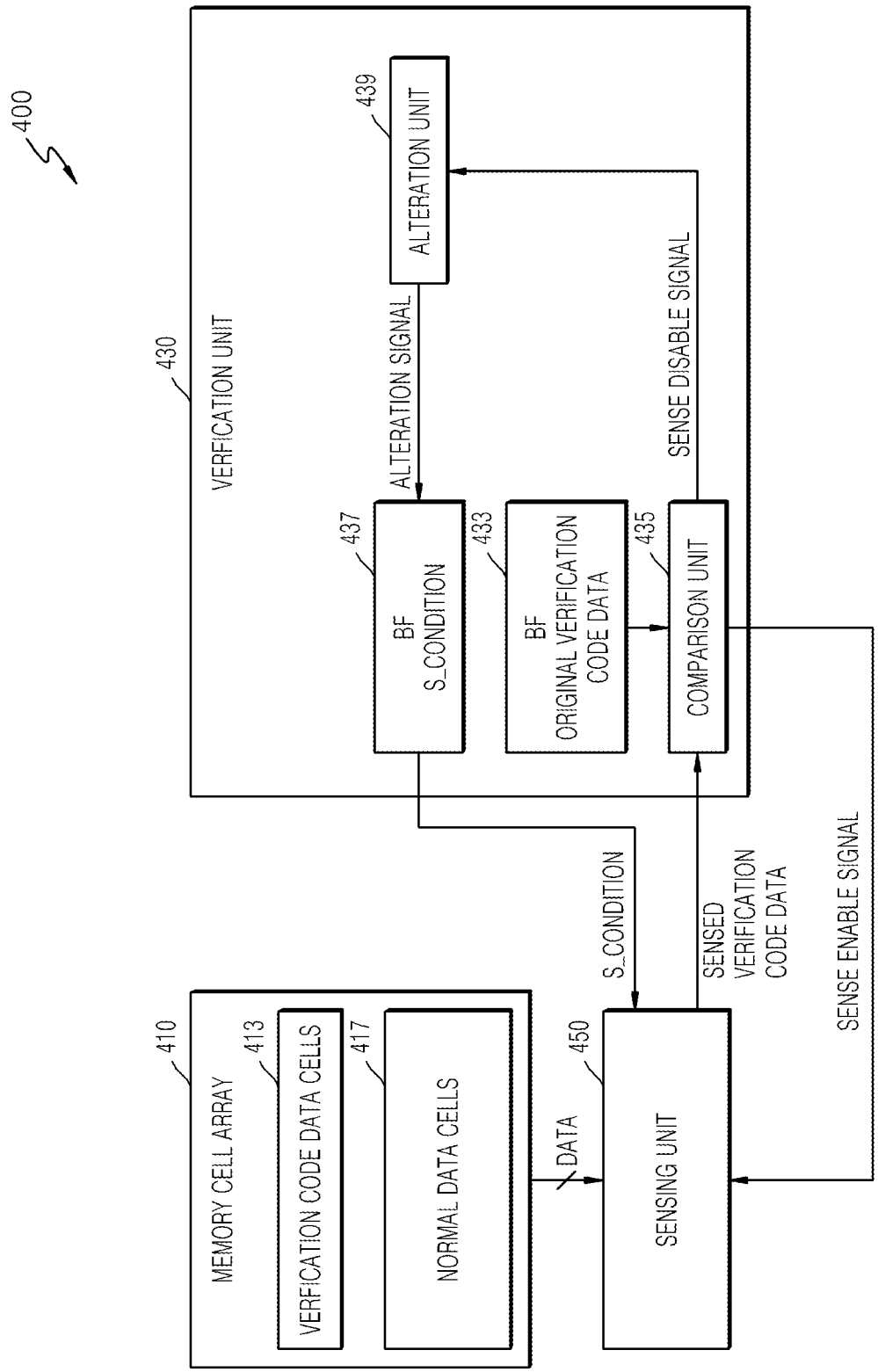
FIG. 4 is a block diagram of a semiconductor memory device according to at least one example embodiment.

FIG. 4 is a block diagram of a semiconductor memory device 400 according to at least one example embodiment.

Referring to FIG. 4, the semiconductor memory device 400 includes a memory cell array 410, a verification unit 430, and a sensing unit 450. The memory cell array 410 and the sensing unit 450 of FIG. 4 respectively correspond to and perform the same functions as the memory cell array 110 and the sensing unit 150 of FIG. 1A.

The verification unit 430 according to the current embodiment includes a buffer 433 for storing original verification code data and a comparison unit 435. The functions of the buffer 433 and the comparison unit 435 of the verification unit 430 may be the same as those of the buffer 333 and the comparison unit 335 of FIG. 3, with the exception that the comparison unit 435 additionally outputs a sense disable signal to the alteration unit 439. The verification unit 430 according to the current embodiment further includes a buffer 437 for storing a sensing condition S_Condition, and an alteration unit 439.

Like the buffer 133 of FIG. 1A, the buffer 437 may be a volatile or nonvolatile memory. Alternatively, the buffer 437 may be a RAM or a ROM. Alternatively, the buffer 437 may be a DRAM, an SRAM, a PRAM, an MRAM, an ReRAM, an FRAM, a NOR flash memory a NAND flash memory, or a fusion flash memory (for example, a memory in which an SRAM buffer, a NAND flash memory, and a NOR interface logic are combined). The buffer 437 stores the sensing condition S_Condition.

When the semiconductor memory device 400 according to the current embodiment is powered on, the sensing unit 450 receives the sensing condition S_Condition from the buffer 437. Also, the buffer 437 may store the sensing condition S_Condition changed by receiving an alteration signal from the alteration unit 439.

The alteration unit 439 may receive a sense disable signal generated by the comparison unit 435. The alteration unit 439 may determine a change of the sensing condition S_Condition by reflecting information included in the sense disable signal. Also, the alteration unit 439 may update the sensing condition S_Condition by reflecting the information included in the sense disable signal.

Operations of the semiconductor memory device 400 will now be described. The sensing unit 450 receives the sensing condition S_Condition from the buffer 437. The sensing unit 450 senses verification code data based on the sensing condition S_Condition. The sensed verification code data is transmitted to the comparison unit 435. The comparison unit 435 compares original verification code data stored in the buffer 433 and the sensed verification code data. When the sensed verification code data and the original verification code data are the same, the comparison unit 435 may generate a sense enable signal. The comparison unit 435 may transmit the sense enable signal to the sensing unit 450. When the sensed verification code data and the original verification code data are not the same, the comparison unit 435 may generate a sense disable signal. The comparison unit 435 may transmit the sense disable signal to the alteration unit 439. The alteration unit 439 may determine a change of the sensing condition S_Condition by reflecting information included in the sense disable signal. Alternatively, the alteration unit 439 may update the sensing condition S_Condition by reflecting the information included in the sense disable signal. Accordingly, the semiconductor memory device 400 may change the sensing condition S_Condition by reflecting a comparison result fed back from the comparison unit 435. Thus, the semiconductor memory device 400 may perform stable sensing by using the changed sensing condition S_Condition.

Figure 5:
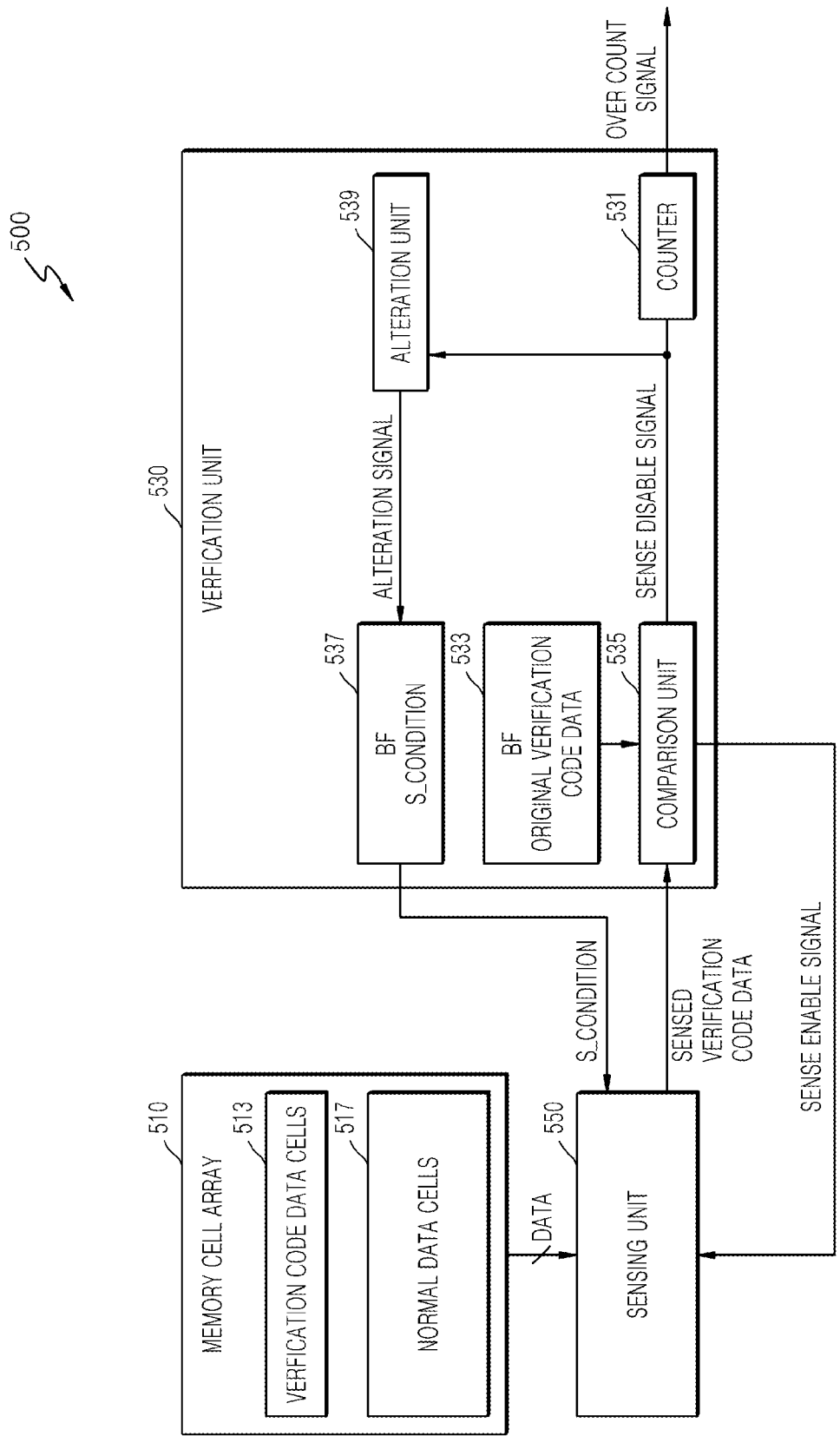
FIG. 5 is a block diagram of a semiconductor memory device according to at least one example embodiment.

FIG. 5 is a block diagram of a semiconductor memory device 500 according to at least one example embodiment.

Referring to FIG. 5, the semiconductor memory device 500 includes a memory cell array 510, a verification unit 530, and a sensing unit 550. The memory cell array 510 and the sensing unit 550 of FIG. 5 respectively correspond to and perform the same functions as the memory cell array 110 and the sensing unit 150 of FIG. 1A.

The verification unit 530 according to the current embodiment includes a buffer 533 for storing original verification code data, a buffer 537 for storing a sensing condition S_Condition, an alteration unit 539, and a comparison unit 535. The functions of the buffer 533, the buffer 537, the alteration unit 539, and the comparison unit 535 included in the verification unit 530 may be the same as those of the buffer 433, the buffer 437, the alteration unit 439, and the comparison unit 435 of FIG. 4, with the exception that the sense disable signal output by the comparison unit 535 may be received by the counter 531 in addition to the alteration unit 539. The verification unit 530 further includes a counter 531.

The counter 531 may count the number of times the sensing condition S_Condition is changed by receiving a sense disable signal from the comparison unit 535. When the number of times is equal to or above a predetermined or, alternatively, reference number, the counter 531 may generate an over count signal.

Operations of the semiconductor memory device 500 will now be described. Operations of the sensing unit 550 and the memory cell array 510 are the same as to those of the sensing unit 450 and the memory cell array 410 of FIG. 4. When sensed verification code data and original verification code data are not the same, the comparison unit 535 may generate a sense disable signal. The comparison unit 535 may transmit the sense disable signal to the alteration unit 539. The alteration unit 539 may determine a change of the sensing condition S_Condition by reflecting information included in the sense disable signal. Also, the alteration unit 539 may update the sensing condition S_Condition by reflecting the information included in the sense disable signal. Also, the comparison unit 535 may transmit the sense disable signal to the counter 531. The counter 531 may count the number of times the sensing condition S_Condition is changed by receiving the sense disable signal. When the number of times is equal to or above a predetermined or, alternatively, reference number, the counter 531 may generate an over count signal. Accordingly, the semiconductor memory device 500 may change the sensing condition S_Condition while preventing the sensing condition S_Condition from being infinitely wrongly changed by reflecting a comparison result fed back from the comparison unit 535.

Figure 6A:
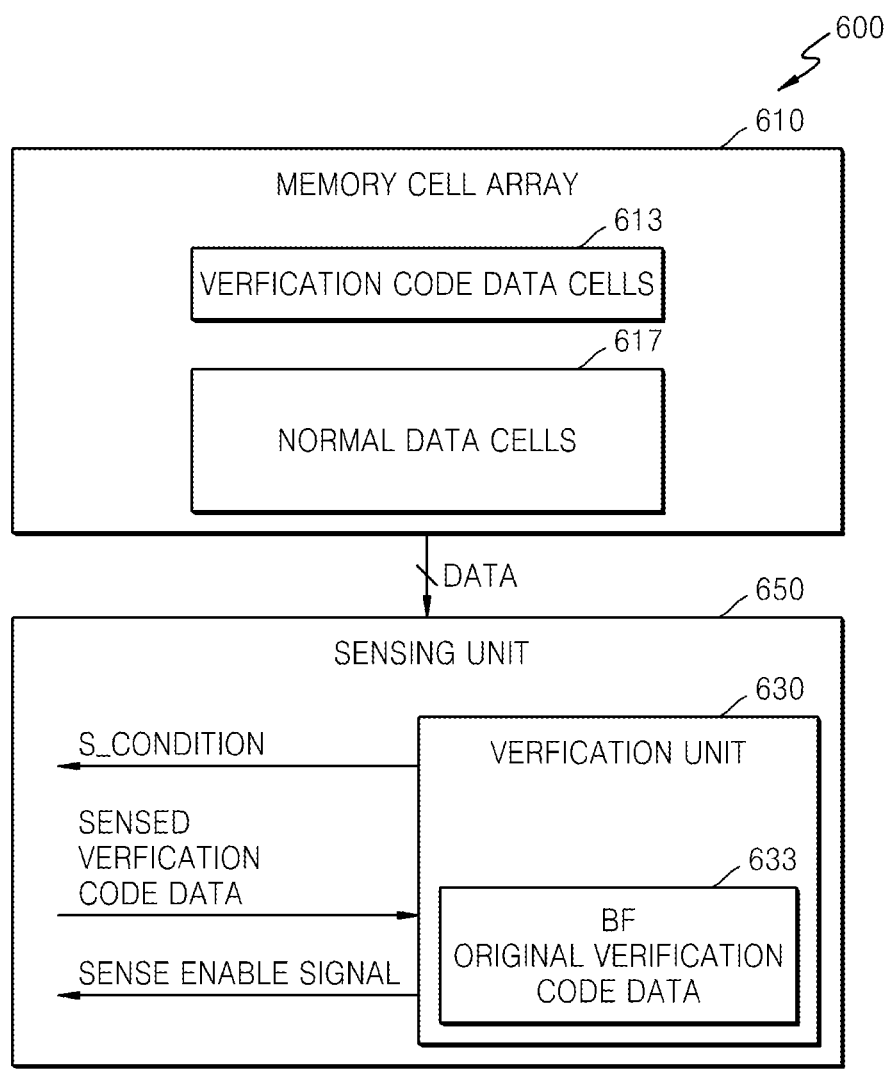
FIG. 6A is a block diagram of a semiconductor memory device according to at least one example embodiment.

FIG. 6A is a block diagram of a semiconductor memory device 600 according to at least one example embodiment.

Referring to FIG. 6A, the semiconductor memory device 600 includes a memory cell array 610, a verification unit 630, and a sensing unit 650. The memory cell array 610 of FIG. 6A corresponds to and performs the same functions as the memory cell array 110 of FIG. 1A.

The sensing unit 650 according to the current embodiment includes the verification unit 630. Operations of the semiconductor memory device 600 are the same as those of the semiconductor memory device 100. However, the sensing unit 650 and the verification unit 630 are not separated. Thus, the semiconductor memory device 600 may be conveniently realized with the sensing unit 650 including the verification unit 630.

Figure 6B:
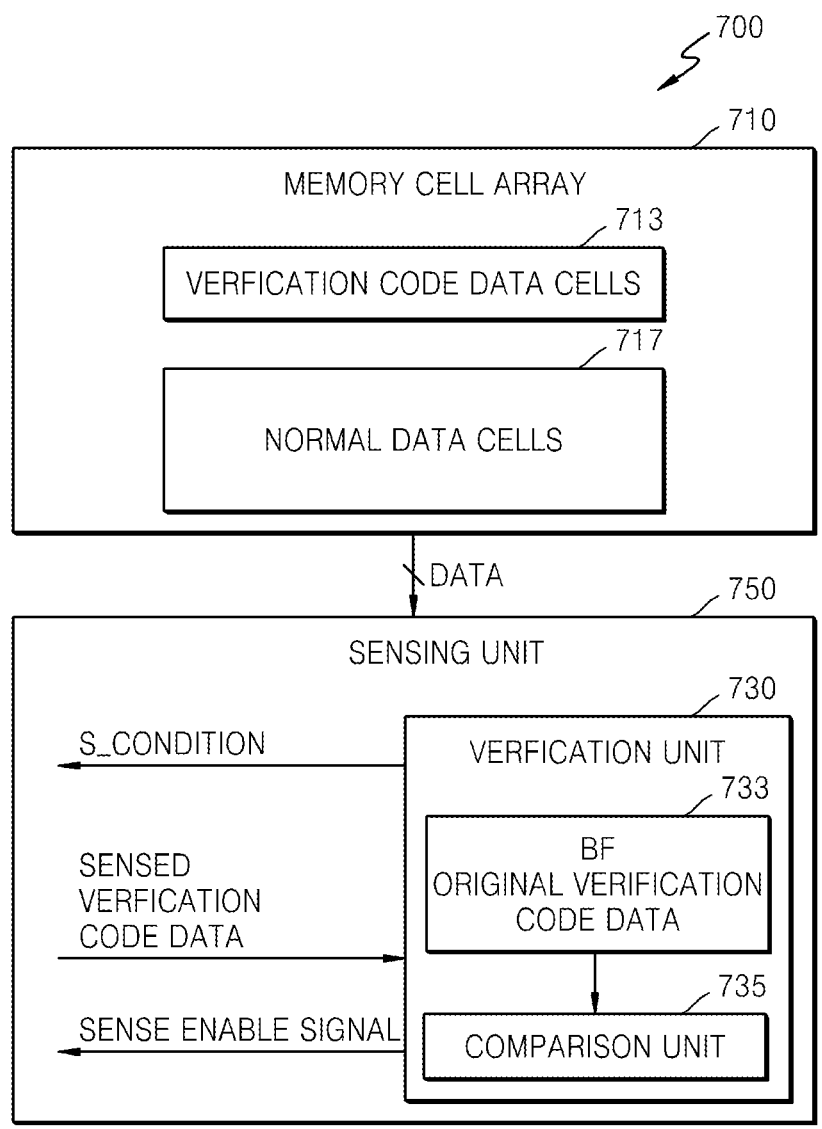
FIG. 6B is a block diagram of a semiconductor memory device according to at least one example embodiment.

FIG. 6B is a block diagram of a semiconductor memory device 700 according to at least one example embodiment.

Referring to FIG. 6B, the semiconductor memory device 700 includes a memory cell array 710, a verification unit 730, and a sensing unit 750. The memory cell array 710 of FIG. 6B corresponds to and performs the same functions as the memory cell array 210 of FIG. 2.

The sensing unit 750 according to the current embodiment includes the verification unit 730. However, unlike the semiconductor memory device 600, the verification unit 730 further comprises a comparison unit 735. Operations of the semiconductor memory device 700 are the same as those of the semiconductor memory device 200. However, like the semiconductor memory device 600, the sensing unit 750 and the verification unit 730 are not separated. Thus, the semiconductor memory device 700 may be conveniently realized.

Figure 7:
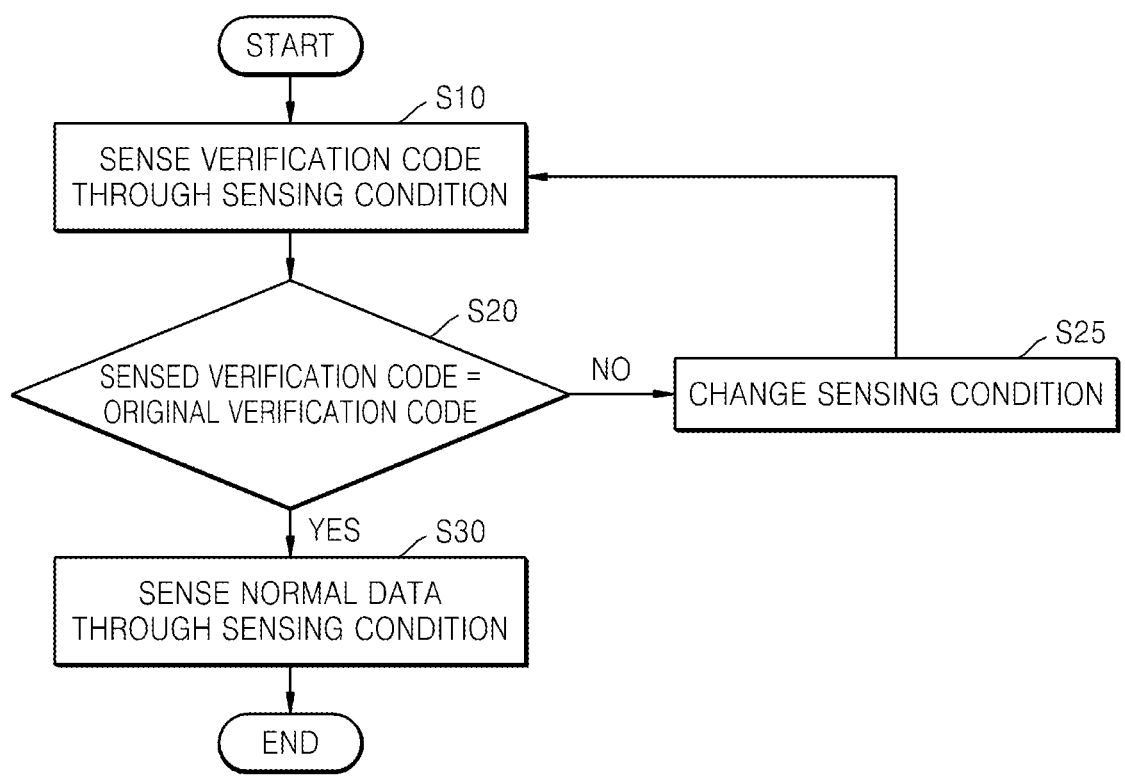
FIG. 7 is a flowchart illustrating a sensing method of a semiconductor memory device, according to at least one example embodiment.

FIG. 7 is a flowchart illustrating a sensing method of a semiconductor memory device, according to at least one example embodiment.

Referring to FIG. 7, a sensing unit senses a verification code through a sensing condition S_Condition in operation S10. It is determined whether sensed verification code data and original verification code data are the same in operation S20. If the sensed verification code data and the original verification code data are the same, normal data is sensed through the sensing condition S_Condition used to sense the verification code, in operation S30. Otherwise, if the sensed verification code data and the original verification code data are not the same, the sensing condition S_Condition is changed in operation S25. Then, operation S10 is performed by using the changed sensing condition S_Condition.

Figure 8:
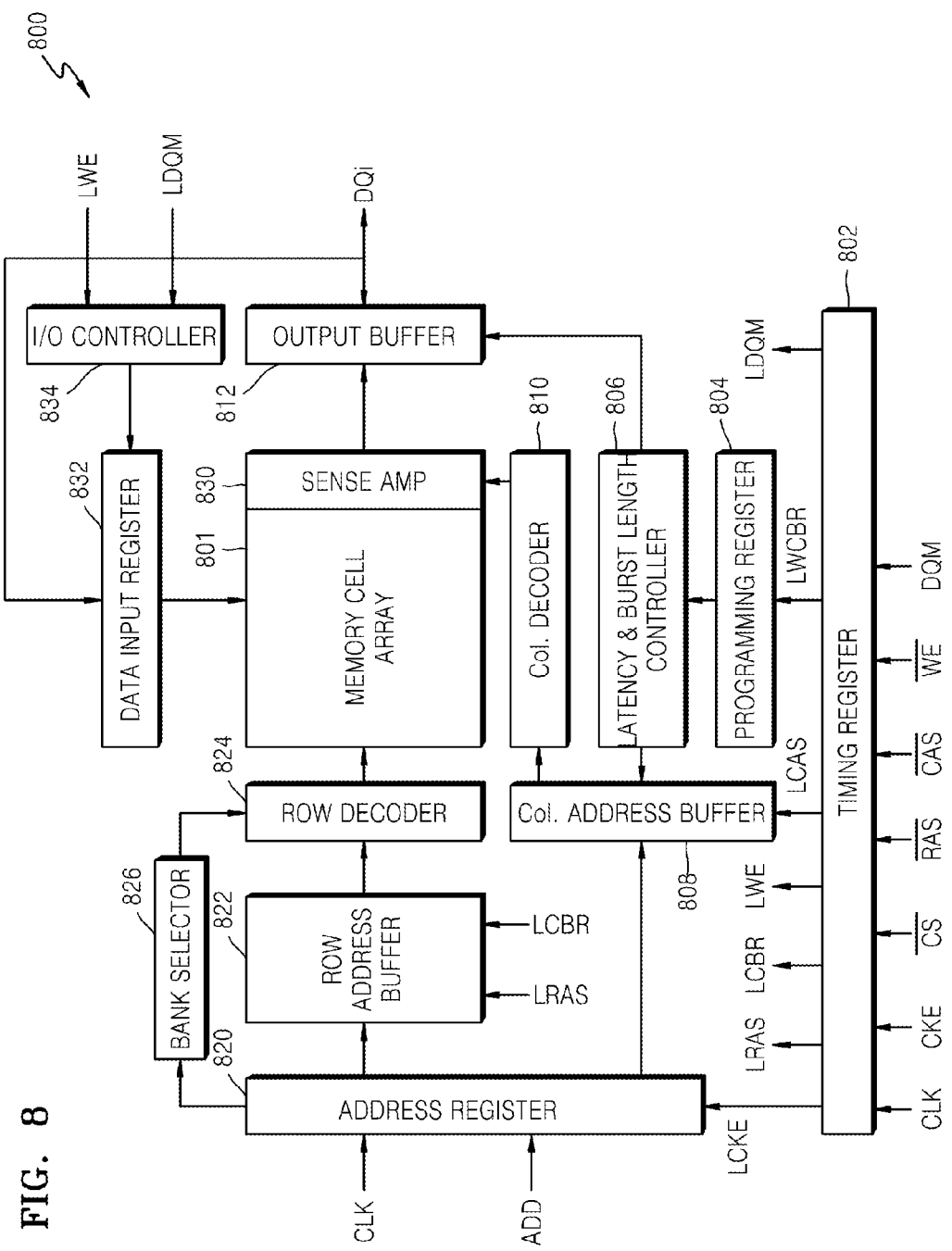
FIG. 8 is a block diagram of a semiconductor memory device according to at least one example embodiment.

FIG. 8 is a block diagram of a memory device 800 including the semiconductor memory device 100 according to at least one example embodiment. Referring to FIG. 8, the memory device 800 may include various circuit blocks for driving a DRAM cell and a memory cell array 801 including OTP semiconductor memory cells. The memory cell array 801 may be implemented by, for example, any of the semiconductor memory devices 100, 200, 300, 400, 500, 600 and 700 discussed above with reference to FIGS. 1-7.

A timing register 802 may be activated when a chip select signal CS is changed from a deactivation level (for example, logic high), to an activation level (for example, logic low). The timing register 802 may receive command signals, such as a clock signal CLK, a clock enable signal CKE, a chip select signal CSB, a row address strobe signal RASB, a column address strobe signal CASK a write enable signal WEB, and a data input/output mask signal DQM, from outside the timing register 802, and generate various internal command signals LRAS, LCBR, LWE, LCAS, LWCBR, and LDQM for controlling the circuit blocks by processing the received command signals.

Some internal command signals generated by the timing register 802 are stored in a programming register 804. For example, latency information or burst length information related to a data output may be stored in the programming register 804. The command signals stored in the programming register 804 may be provided to a latency and burst length controller 806, and the latency and burst length controller 806 may provide a control signal for controlling latency or burst length of data to a column decoder 810 or an output buffer 812 through a column address buffer 808.

An address register 820 may receive an address signal ADD from outside the address register 820. A row address signal may be provided to a row decoder 824 through a row address buffer 822. Also, a column address signal may be provided to the column decoder 810 through the column address buffer 808. The row address buffer 822 may further receive a refresh address signal generated by a refresh counter in response to a refresh command LRAS or LCBR, and provide any one of a row address signal and a refresh address signal to the row decoder 824. Also, the address register 820 may provide a bank signal for selecting a bank to a bank selector 826.

The row decoder 824 may decode the row address signal or refresh address signal input from the row address buffer 822, and activate a word line of the memory cell array 801. The column decoder 810 may decode the column address signal and perform a select operation on a bit line of the memory cell array 801. For example, a column selection line may be applied to the memory device 800, and thus a select operation may be performed through a column selection line.

A sense amplifier 830 may amplify data of a memory cell selected by the row and column decoders 824 and 810, and provide the amplified data to the output buffer 812. Data for recording on a data cell is provided to the memory cell array 801 through a data input register 832, and an input/output (I/O) controller 834 may control a data transmission operation through the data input register 832.

Figure 9:
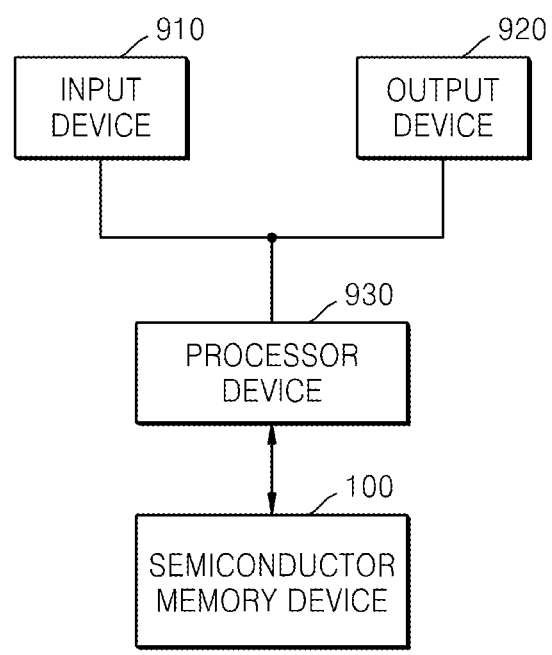
FIG. 9 is a block diagram of an electronic system including the semiconductor memory device of FIG. 1, according to at least one example embodiment.

FIG. 9 is a block diagram of an electronic system 900 including the semiconductor memory device 100, according to at least one example embodiment.

Referring to FIG. 9, the electronic system 900 includes an input device 910, an output device 820, a processor device 930, and the semiconductor memory device 100. The processor device 930 may control the input device 910, the output device 920, and the semiconductor memory device 100 through a corresponding interface. The processor device 930 may include at least a microprocessor, a digital signal processor, a microcontroller, and at least any one of logic devices that perform similar operations as thereof. The input device 910 and the output device 920 may include at least one of a keypad, a keyboard, and a display device.

The semiconductor memory device 100 may include an OTP semiconductor memory device. In the memory system 900, the semiconductor memory device 100 may be replaced by any one of the semiconductor memory devices 200 through 700 described above with reference to FIGS. 1-7. A voltage comparison unit COM compares an input voltage Vin generated by a voltage generator GEN with a predetermined or, alternatively, reference voltage Vref. The voltage comparison unit COM outputs an activation signal ACS according to a comparison result, and the voltage generator GEN generates an increased voltage Vpp by increasing the input voltage Vin to a predetermined or, alternatively, reference value in response to the activation signal ACS. If a level of the increased voltage Vpp is equal to or above a desired level, the voltage comparison unit COM does not output the activation signal ACS, and thus the increased voltage Vpp maintains a stable level without being further increased. Here, a counter CNT counts the number of times the activation signal ACS is generated by the voltage comparison unit COM. Based on the counted number, a semiconductor memory device may be determined to be defective.

Figure 10:
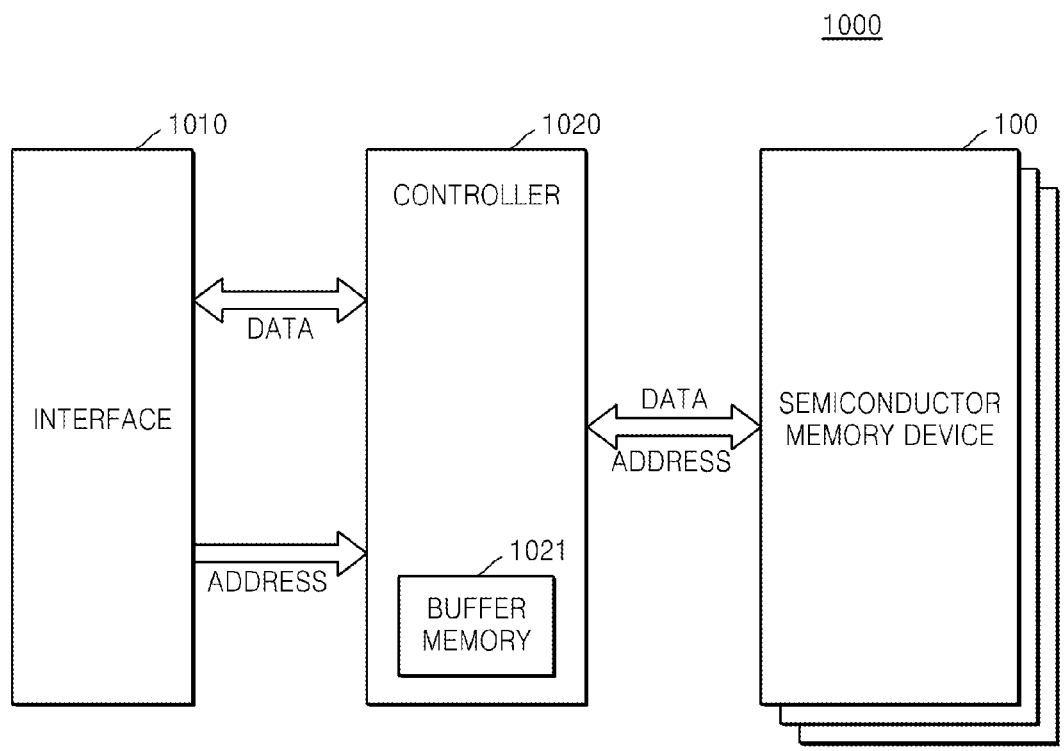
FIG. 10 is a block diagram of a memory system using the semiconductor memory device of FIG. 1, according to at least one example embodiment.

FIG. 10 is a block diagram of a memory system 1000 using the semiconductor memory device 100, according to at least one example embodiment.

Referring to FIG. 10, the memory system 1000 includes an interface 1010, a controller 1020, and the semiconductor memory device 100. The interface 1010 may provide an interface between the memory system 1000 and a host (not shown). The interface 1010 may include a data exchange protocol corresponding to the host to interface with the host. The interface 1010 may be configured to communicate with the host through one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), and integrated drive electronics (IDE).

The controller 1020 may receive data and an address from outside the memory system 1000 through the interface 1010. The controller 1020 may access the semiconductor memory device 100 by referring to the data and address provided from the host. The controller 1020 may transfer data read from the semiconductor memory device 100 to the host through the interface 1010.

The controller 1020 may include a buffer memory 1021. The buffer memory 1021 temporarily stores write data provided from the host or data read from the semiconductor memory device 100. When data existing in the semiconductor memory device 100 is cached during a read request of the host, the buffer memory 1021 supports a cache function of providing cached data directly to the host. Generally, a data transmission speed by a bus format (for example, SATA or SAS) of the host is remarkably quicker than a transmission speed of a memory channel in the memory system 1000. In other words, if an interface speed of the host is remarkably high, performance deterioration due to a speed difference may be reduced by providing the buffer memory 1021.

According to at least one example embodiment, the semiconductor memory device 100 may be an OTP semiconductor memory device. The semiconductor memory device 100 may be provided as a storage medium of the memory system 1000. According to at least some example embodiments, in the memory system 1000, the semiconductor memory device 100 may be replaced by any one of the semiconductor memory devices 200 through 700 described above with reference to FIGS. 1-7.

Figure 11:
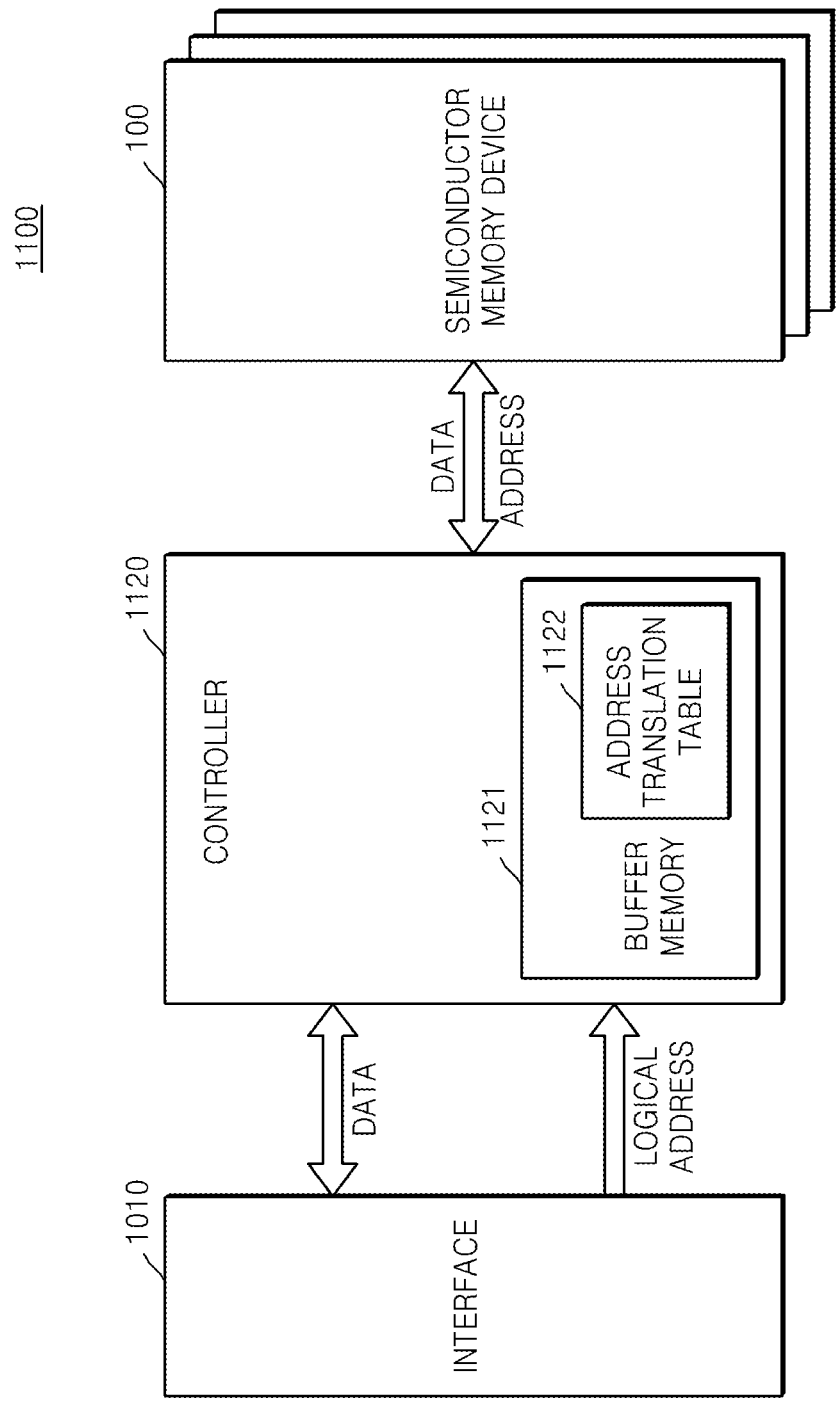
FIG. 11 is a block diagram of a memory system using the semiconductor memory device of FIG. 1, according to at least one example embodiment.

FIG. 11 is a block diagram of a memory system 1100 using the semiconductor memory device 100, according to at least one example embodiment.

Referring to FIG. 11, the memory system 1100 includes the interface 1010, a controller 1120, and the semiconductor memory device 100. As described above with reference to FIG. 10, the interface 1010 may include a data exchange protocol corresponding to a host to interface with the host. According to at least one example embodiment, the semiconductor memory device 100 may be an OTP semiconductor memory device. The memory system 1100 may be referred to as an OTP memory system.

The controller 1120 may include a buffer memory 1121 including an address translation table 1122. The controller 1120 may convert a logical address provided from the interface 1010 to a physical address by referring to the address translation table 1122. The controller 1120 may access the semiconductor memory device 100 by referring to the physical address.

The memory systems 1000 and 1100 of FIGS. 10 and 11 may be installed on an information processing apparatus, such as a personal digital assistant (PDA), a portable computer, a web tablet, a digital camera, a portable media player (PMP), a mobile phone, a wireless phone, or a laptop. The memory systems 1000 and 1100 may include an MMC card, a secure digital (SD) card, a micro SD card, a memory stick, an identification (ID) card, a personal computer memory card international association (PCMCIA) card, a chip card, a USB card, a smart card, or a compact flash (CF) card. According to at least some example embodiments, in the memory system 1100, the semiconductor memory device 100 may be replaced by any one of the semiconductor memory devices 200 through 700 described above with reference to FIGS. 1-7.

Figure 12:
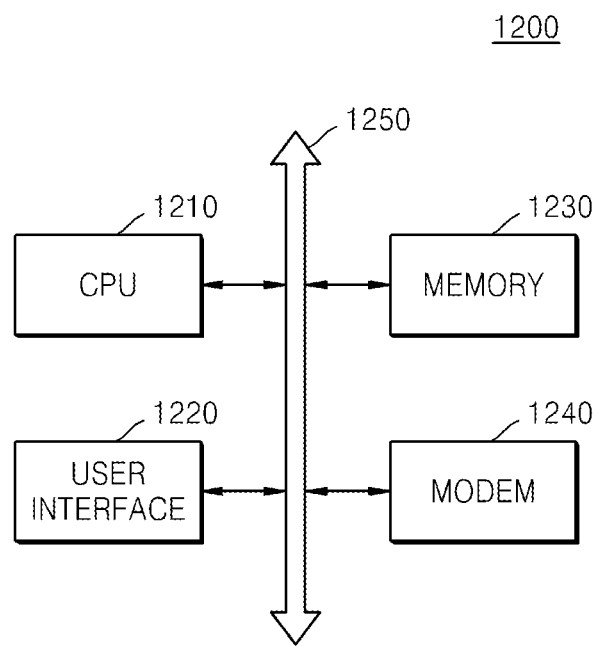
FIG. 12 is a diagram of a computer system including a semiconductor device, according to at least one example embodiment.

FIG. 12 is a diagram of a computer system 1200 including a semiconductor device, according to at least one example embodiment.

Referring to FIG. 12, the computer system 1200 may include a central processing unit (CPU) 1210, a user interface 1220, a memory 1230, and a modem 1240, such as a baseband chipset, which are electrically connected to a system bus 1250. The user interface 1220 may be an interface for transmitting or receiving data to or from a communication network. The user interface unit 1220 may be wired or wireless, and may include an antenna or a wired/wireless transceiver. Data provided by the user interface 1220 or the modem 1240 or processed by the CPU 1210 may be stored in the memory 1230.

The memory 1230 may include a volatile memory device such as DRAM and/or a nonvolatile memory device such as a flash memory. The memory 1230 may include a DRAM, a PRAM, an MRAM, an ReRAM, an FRAM, a NOR flash memory, a NAND flash memory, or a fusion flash memory (for example, a memory in which an SRAM buffer, a NAND flash memory, and a NOR interface logic are combined), where the semiconductor memory device 100 is disposed. According to at least some example embodiments, in the memory system 1200, the semiconductor memory device 100 may be replaced by any one of the semiconductor memory devices 200 through 700 described above with reference to FIGS. 1-7.

If the computer system 1200 is a mobile device, a battery (not shown) for supplying an operation voltage of the computer system 1200 may be further included. Although not shown, the computer system 1200 may further include an application chipset, a camera image processor (CIP), and an I/O device.

If the computer system 1200 is a device that performs a wireless communication, the computer system 1200 may be used in a communication system, such as code division multiple access (CDMA), global system for mobile communication (GSM), North American Digital Cellular (NADC), or CDMA2000.

Figure 13:
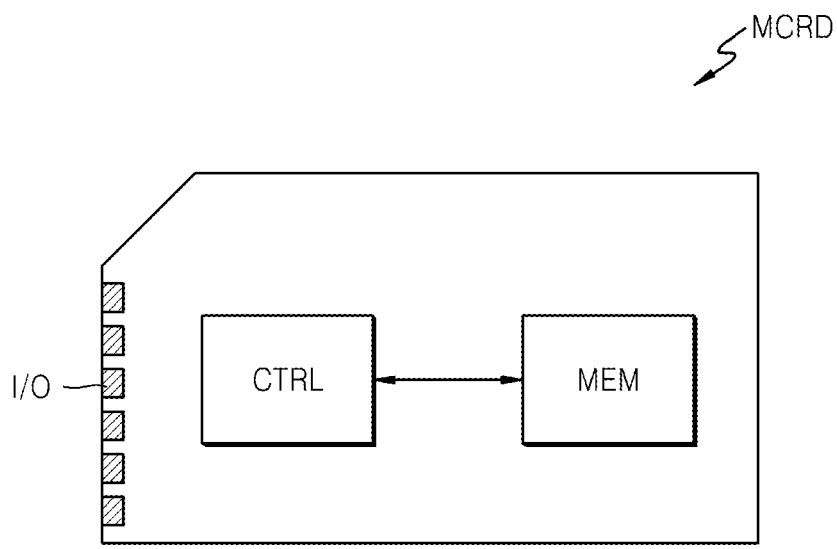
FIG. 13 is a schematic diagram of a memory card according to at least one example embodiment.

FIG. 13 is a schematic diagram of a memory card MCRD according to at least one example embodiment.

Referring to FIG. 13, the memory card MCRD according to the current embodiment includes a memory controller CTRL and a memory device MEM. The memory device MEM may include a semiconductor memory device according to at least one example embodiment. The memory controller CTRL controls data writing on the memory device MEM or data sensing from the memory device MEM in response to a request of an external host received through an I/O unit I/O. Also, if the memory device MEM is a flash memory device, the memory controller CTRL controls an erase operation on the memory device MEM. In order to perform such control operations, the memory controller CTRL of the memory card MCRD may include a RAM and interfaces for interfacing with a host and a memory device. The memory device MEM may include the semiconductor memory device 100 of FIG. 1. According to at least some example embodiments, in the memory card MCRD, the semiconductor memory device 100 may be replaced by any one of the semiconductor memory devices 200 through 700 described above with reference to FIGS. 1-7.

The memory card MCRD of FIG. 13 may be a compact flash card (CFC), a microdrive, a smart media card (SMC), an MMC, a security digital card (SDC), a memory stick, or a USB flash memory.

Figure 14:
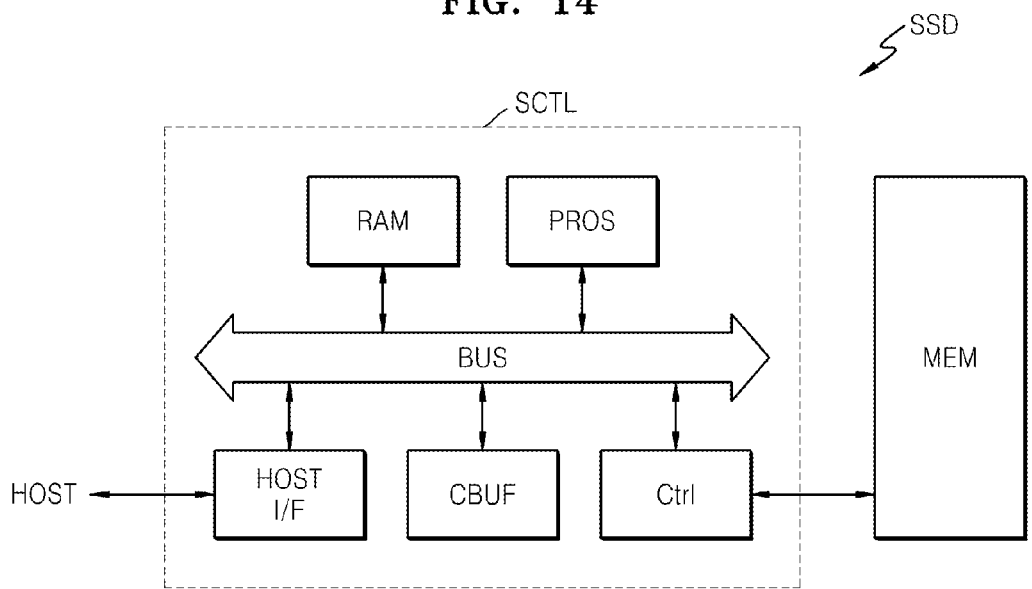
FIG. 14 is a diagram of a semiconductor storage system being a solid state drive (SSD), according to at least one example embodiment.

FIG. 14 is a diagram of a semiconductor storage system MSYS being a solid state drive (SSD), according to at least one example embodiment.

Referring to FIG. 14, the SSD includes an SSD controller SCTL and a memory device MEM. The memory device MEM may include the semiconductor memory device 100. The SSD controller SCTL may include a processor PROS, a RAM, a cache buffer CBUF, and a memory controller CTRL, which are connected to a bus BUS. The processor PROS controls the memory controller CTRL to transmit and receive data with the memory device MEM in response to a request (command, address, or data) of a host. The processor PROS and the memory controller CTRL of the SSD may be realized as one ARM processor. Data required for operations of the processor PROS may be loaded in the RAM. According to at least some example embodiments, in the semiconductor storage system MSYS, the semiconductor memory device 100 may be replaced by any one of the semiconductor memory devices 200 through 700 described above with reference to FIGS. 1-7.

A host interface HOST I/F receives and transmits a request of the host to the processor PROS or transmits data received from the memory device MEM to the host. The host interface HOST I/F may interface with the host by using any one of various interface protocols, such as USB, MMC, PCI-E, SATA, PATA, SCSI, ESDI, and IDE. Data to be transmitted to the memory device MEM or transmitted from the memory device MEM may be temporarily stored in the cache buffer CBUF. The cache buffer CBUF may be an SRAM.

A semiconductor memory device according to at least one example embodiment described above may be installed by using a package having any one of various shapes. For example, the semiconductor memory device may be installed by using a package, such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a metric quad flat pack (MQFP), a thin quad flat pack (TQFP), a small-outline integrated circuit (SOIC), a shrink small outline package (SSOP), a thin small outline (TSOP), a thin quad flat pack (TQFP), a system in package (SIP), a multi chip package (MCP), a wafer-level fabricated Package (WFP), or a wafer-level processed stack package (WSP).

Figure 15:
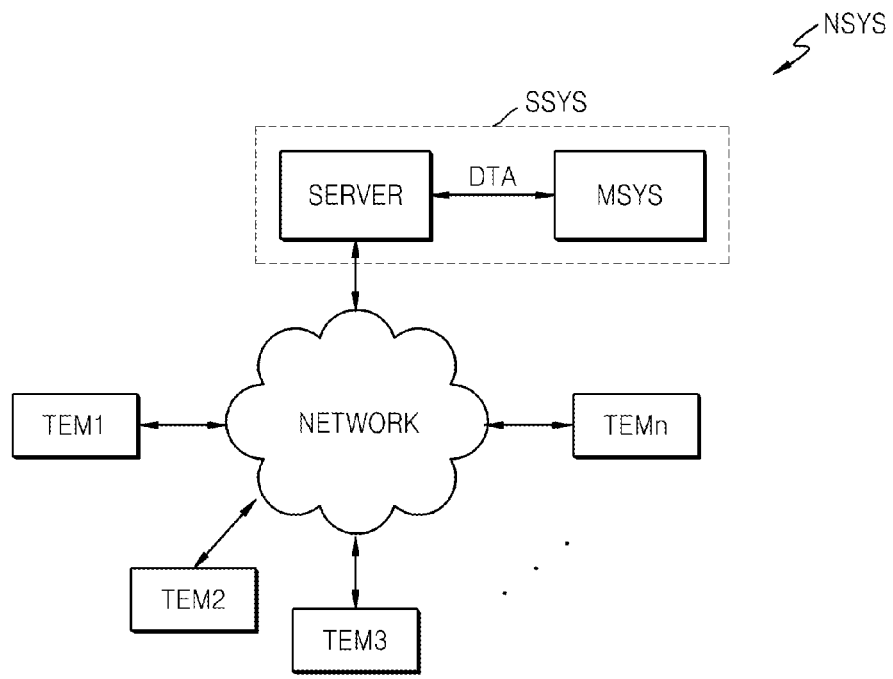
FIG. 15 is a diagram of a server system including a semiconductor memory system, and a network system (see comment G), according to at least one example embodiment.

FIG. 15 is a diagram of a network system NSYS including a server system SSYS including a semiconductor memory system MSYS, according to at least one example embodiment.

Referring to FIG. 15, the network system NSYS according to the current embodiment may include the server SSYS and a plurality of terminals TEM1 through TEMn connected via a network. The server system SSYS according to the current embodiment may be configured to include a server for processing a request received from the terminals TEM1 through TEMn, and an SSD MSYS for storing data corresponding to the request received from the terminals TEM1 through TEMn. Here, the SSD of FIG. 15 may be the SSD of FIG. 14.

Figure 16:
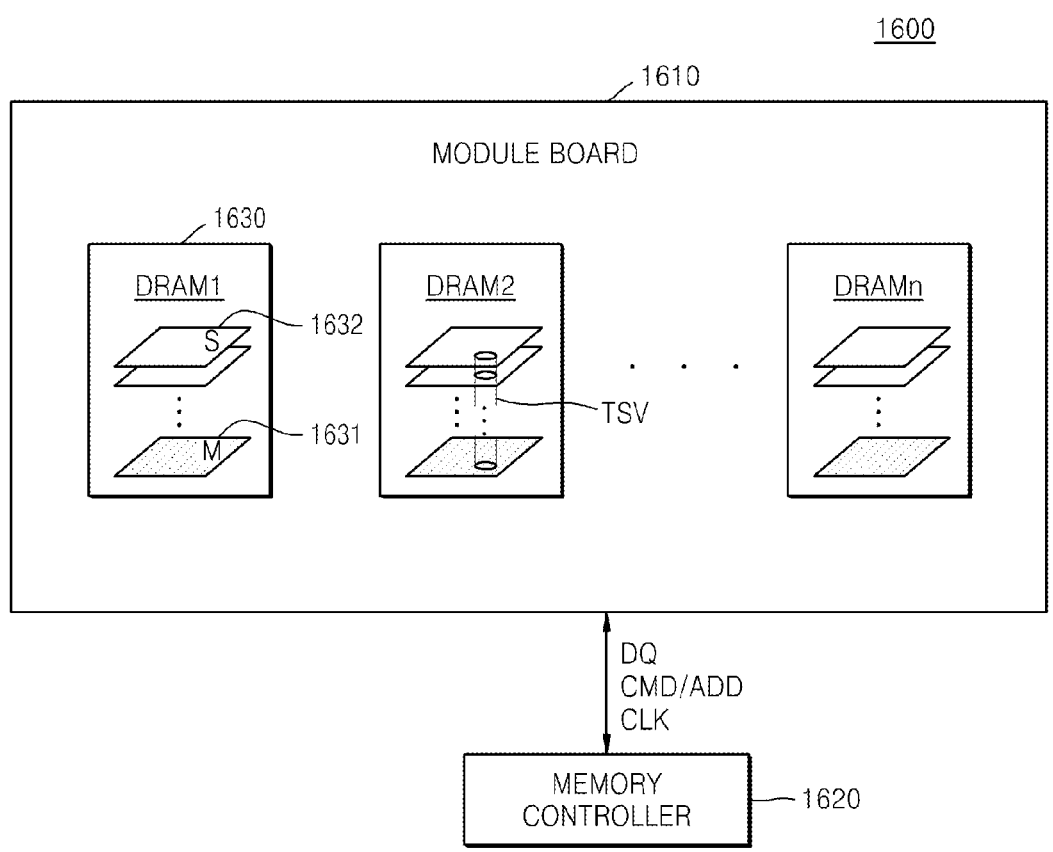
FIG. 16 is a diagram of a memory system to which the semiconductor memory device of FIG. 8 is applied, according to at least one example embodiment.

FIG. 16 is a diagram of a memory system 1600 to which the semiconductor memory device 800 of FIG. 8 is applied, according to at least one example embodiment.

Referring to FIG. 16, the memory system 1600 may include a memory module 1610 and a memory controller 1620. The memory module 1610 may include at least one semiconductor memory device 1630 on a module board. The semiconductor memory device 1630 may be realized in a DRAM chip may include a plurality of semiconductor layers. A semiconductor layer may include at least one master chip 1631 and at least one slave chip 1632. A signal may be transferred between the semiconductor layers through a through-silicon via (TSV).

In the current embodiment, a structure in which a signal is transferred between the semiconductor layers through the through-silicon via TSV is described. However, alternatively, the memory system 1600 may also have a structure where the semiconductor layers are stacked on each other through a tape including a wire bonding, an interpose, or a wire.

Also, the signal may be transferred between the semiconductor layers through an optical IO connection. For example, the semiconductor layers may be connected to each other by using a radiative method using radio frequency (RF) wave or ultrasonic waves, an inductive coupling method using magnetic induction, or a non-radiative method using magnetic field resonance.

The radiative method wirelessly transfers a signal by using an antenna, such as a monopole or a planar inverted-F antenna (PIFA). Radiation is generated while electric fields or magnetic fields changing according to time affect each other, and a signal may be received according to polarization characteristics of incident waves when there are antennas having the same frequency. The inductive coupling method generates a strong magnetic field in one direction by winding a coil several times, and generates coupling by approaching coils resonating at similar frequencies. The non-radiative method uses evanescent wave coupling that moves electromagnetic waves between two media resonating at the same frequency through a short-distance electromagnetic field. According to at least one example embodiment, either one or both of the master chip 1631 and the slave chip 1632 may include the memory device 800 illustrated in FIG. 8. The memory module 1610 may communicate with the memory controller 1620 through a system bus. Data DQ, a command/address CMD/ADD, and a clock signal CLK may be transferred between the memory module 1610 and the memory controller 1620 through the system bus.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor memory device comprising:
   a memory cell array configured to store data including a verification code;
   a sensing unit configured to sense the stored data including the verification code; and
   a verification unit configured to determine whether the sensing unit is able to sense the stored data based on a sensing condition,
   wherein the verification unit is configured to determine whether the sensing unit is able to sense the stored data based on the sensing condition, a value of the verification code sensed by the sensing unit, and a value of an original verification code.

2. The semiconductor memory device of claim 1, wherein the verification unit comprises:
   a comparison unit configured to compare the sensed value of the verification code and the value of the original verification code, and
   wherein the verification unit is configured to determine whether the sensing unit is able to sense the stored data based on the sensing condition and a comparison result of the comparison unit comparing the sensed value of the verification code and the value of the original verification code.

3. The semiconductor memory device of claim 2, wherein, when the sensed value of the verification code and the value of the original verification code are the same based on the comparison result of the comparison unit, the verification unit determines the sensing unit is able to sense the stored data.

4. The semiconductor memory device of claim 2, wherein the verification unit comprises:
   an alteration unit configured to change the sensing condition, and
   wherein the verification unit and alteration unit are configured such that when the sensed value of the verification code and the value of the original verification code are not the same based on the comparison result of the comparison unit, the verification unit determines that sensing unit is not able to sense the stored data using the sensing condition, the alteration unit changes the sensing condition, and the verification unit determines whether the sensing unit can sense the stored data using the changed sensing condition.

5. The semiconductor memory device of claim 4, wherein the sensing unit is configured such that the sensing unit again senses the verification code stored in the memory cell array based on the changed sensing condition,
   the comparison unit is configured such that the comparison unit again compares the again-sensed value of the verification code and the value of the original verification code, and
   the verification unit is configured such that the verification unit determines whether the sensing unit is able to sense the stored data based on the changed sensing condition through a comparison result of the comparison unit comparing the again-sensed value of the verification code and the value of the original verification code again.

6. The semiconductor memory device of claim 5, wherein, the verification unit is configured such that when the sensed value of the verification code and the value of the original verification code are not the same, the verification unit repeats sensing while changing the sensing condition until the sensed value of the verification code is same as the value of the original verification code.

7. The semiconductor memory device of claim 6, wherein the verification unit further comprises:
   a counter configured to count the number of times the sensing condition is changed, and
   wherein the verification unit is configured to determine that the sensing unit is not able to sense the stored data when the number of times counted by the counter is equal to or above a reference number.

8. The semiconductor memory device of claim 1, wherein the sensing condition includes at least one of a sensing voltage level and a sensing timing.

9. The semiconductor memory device of claim 8, wherein the verification unit comprises:
   a buffer configured to store data about the sensing voltage level and the sensing timing.

10. The semiconductor memory device of claim 1, wherein, the verification unit and the sensing unit are configured such that if the verification unit determines that the data of the memory cell array is able to be sensed based on the sensing condition, the sensing unit senses the data based on the sensing condition determined by the verification unit.

11. The semiconductor memory device of claim 1, wherein the verification unit is configured such that the verification unit performs a verification operation on the sensing condition, and
 the sensing unit is configured such that if the verification unit determines that the sensing condition is verified, the sensing unit senses the data based on the sensing condition.

12. The semiconductor memory device of claim 1, wherein the semiconductor memory device is a one-time programmable (OTP) semiconductor memory device.

13. A semiconductor memory device comprising:
 a memory cell array configured to store data including a verification code; and
 a sensing unit configured to sense the stored data including the verification code, the sensing unit including a verification unit configured to determine whether the sensing unit is able to sense the stored data based on a sensing condition, the verification unit being configured to determine whether the data of the memory cell array is able to be sensed based on the sensing condition, a value of the verification code sensed by the sensing unit, and a value of an original verification code.

14. The semiconductor memory device of claim 13, wherein the verification unit comprises:
 a comparison unit configured to generate a comparison result based on the sensed value of the verification unit and the value of the original verification code, and
 wherein the verification unit is configured to determine whether the sensing unit is able to sense the stored data based on the sensing condition and the comparison result.

15. The semiconductor memory device of claim 14, wherein the verification unit further comprises:
 an alteration unit configured to change the sensing condition, and wherein the verification unit and the alteration unit are configured such that if the sensed value of the verification code and the value of the original verification code are not the same based on the comparison result, the verification unit determines that the sensing unit is not able to sense the stored data using the sensing condition, the alteration unit changes the sensing condition, and the verification unit determines whether the sensing unit is able to sense the stored data using the changed sensing condition.

16. A semiconductor memory device comprising:
 a memory cell array storing verification data and non-verification data;
 a verification unit configured to output a first sensing condition; and
 a sensing unit configured to generate a sensed verification code by sensing the stored verification data based on the first sensing condition, and to output the sensed verification code to the verification unit,
 the verification unit being configured generate a verification result based on the sensed verification code and to output an enable signal based on the verification result,
 the sensing unit being configured to determine whether or not to sense the stored non-verification data based on the enable signal.

17. The semiconductor memory device of claim 16, wherein the verification unit comprises:
 a buffer storing a reference verification code; and
 a comparison unit configured to generate the verification result based on the sensed verification code and the reference verification code.

18. The semiconductor memory device of claim 17, wherein the comparison unit is further configured to output a disable signal based on the verification result and the verification unit further comprises:
 an alteration unit configured to generate an altered sensing condition by altering the first sensing condition based on the disable signal.

* * * * *